(12) United States Patent
Huang

(10) Patent No.: US 11,044,809 B2
(45) Date of Patent: Jun. 22, 2021

(54) FLEXIBLE CIRCUIT BOARD, DISPLAY PANEL, AND DISPLAY MODULE

(71) Applicant: Wuhan China Star Optoelectronics Semiconductor Display Technology Co., Ltd., Wuhan (CN)

(72) Inventor: Cui Huang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 39 days.

(21) Appl. No.: 16/494,300

(22) PCT Filed: Nov. 5, 2018

(86) PCT No.: PCT/CN2018/113946
§ 371 (c)(1),
(2) Date: Sep. 15, 2019

(87) PCT Pub. No.: WO2019/237643
PCT Pub. Date: Dec. 19, 2019

(65) Prior Publication Data
US 2020/0236776 A1     Jul. 23, 2020

(30) Foreign Application Priority Data

Jun. 15, 2018   (CN) .......................... 201810622686.6

(51) Int. Cl.
| | | |
|---|---|---|
| *H05K 1/00* | (2006.01) | |
| *H05K 1/02* | (2006.01) | |
| *H05K 1/11* | (2006.01) | |
| *H05K 1/14* | (2006.01) | |
| *H05K 1/18* | (2006.01) | |

(Continued)

(52) U.S. Cl.
CPC ......... *H05K 1/028* (2013.01); *G02F 1/13452* (2013.01)

(58) Field of Classification Search
CPC ... H05K 1/00; H05K 1/02; H05K 1/11; H05K 1/14; H05K 1/18; H05K 3/38; H05K 3/361; H05K 7/06; G02F 1/1333; G02F 1/1345
USPC ........... 361/749; 174/251, 254, 261; 349/62, 349/149
See application file for complete search history.

(56) References Cited

U.S. PATENT DOCUMENTS 4,032,945 A * 6/1977 Mori .................... H01L 33/0025
257/95
4,467,189 A * 8/1984 Tsuchiya ............... H01J 31/502
250/214 VT (Continued)

FOREIGN PATENT DOCUMENTS

| CN | 105572985 | 5/2016 |
|---|---|---|
| CN | 205958872 | 2/2017 |

(Continued)

*Primary Examiner* — Xiaoliang Chen

(57) ABSTRACT

A flexible circuit board, a display panel and a display module are provided. The flexible circuit board includes a substrate layer and a colloid layer. The substrate layer has a lamination area and a non-lamination area, the lamination area is used to laminate and connect the flexible circuit board with the display panel, and the lamination area includes a guiding structure. The colloid layer is disposed on a side surface of the substrate layer including the guiding structure, and the guiding structure is used to guide a flow direction of a colloid in the colloid layer when the colloid layer is melted by heat.

6 Claims, 5 Drawing Sheets

(51) Int. Cl.
*H05K 3/38* (2006.01)
*H05K 7/06* (2006.01)
*G02F 1/1333* (2006.01)
*G02F 1/1345* (2006.01)

(56) References Cited

U.S. PATENT DOCUMENTS

| | | | | |
|---|---|---|---|---|
| 4,755,415 A | * | 7/1988 | Iijima | G02F 1/0551 385/132 |
| 5,688,574 A | * | 11/1997 | Tamura | G11B 7/24 369/283 |
| 6,214,519 B1 | * | 4/2001 | Suzuki | G11B 7/244 369/275.4 |
| 6,261,858 B1 | * | 7/2001 | Kitaoka | G02B 6/4202 438/31 |
| 6,329,631 B1 | * | 12/2001 | Yueh | B23K 3/06 219/121.65 |
| 9,321,264 B2 | * | 4/2016 | Hirai | B41J 2/1637 |
| 2002/0123144 A1 | * | 9/2002 | Helmstetter | C12N 5/0694 435/372 |
| 2003/0067014 A1 | * | 4/2003 | Tsuruta | H01L 21/76208 257/200 |
| 2004/0156289 A1 | * | 8/2004 | Iida | G11B 27/329 369/53.21 |
| 2004/0218798 A1 | * | 11/2004 | Abdel-Fattah | G01N 15/1463 382/133 |
| 2006/0044353 A1 | * | 3/2006 | Kobayashi | B41J 2/17563 347/54 |
| 2006/0146262 A1 | * | 7/2006 | Yu | H05K 3/361 349/149 |
| 2006/0207720 A1 | * | 9/2006 | Yoshizawa | B41J 2/1609 156/325 |
| 2007/0087481 A1 | * | 4/2007 | Bai | H01L 21/563 438/118 |
| 2007/0202560 A1 | * | 8/2007 | Kikuchi | B01L 3/502707 435/14 |
| 2007/0284135 A1 | * | 12/2007 | Matsui | H05K 3/361 174/254 |
| 2009/0321920 A1 | * | 12/2009 | Sakurada | H01L 21/561 257/698 |
| 2013/0021557 A1 | * | 1/2013 | Momose | G02B 6/0036 349/62 |
| 2013/0229462 A1 | * | 9/2013 | Yamada | B41J 2/162 347/45 |
| 2013/0264103 A1 | * | 10/2013 | Ye | H05K 1/0277 174/254 |
| 2014/0151714 A1 | * | 6/2014 | Park | C30B 29/406 257/76 |
| 2016/0143174 A1 | * | 5/2016 | Cho | H05K 3/323 361/749 |
| 2016/0185653 A1 | * | 6/2016 | Fushie | C03C 10/0027 428/131 |
| 2016/0194240 A1 | * | 7/2016 | Fushie | C03C 3/095 430/270.1 |
| 2016/0278210 A1 | * | 9/2016 | Tsuruoka | H05K 1/117 |
| 2016/0341988 A1 | * | 11/2016 | Ye | G02F 1/1333 |
| 2017/0092813 A1 | * | 3/2017 | Minato | H01L 33/44 |
| 2018/0082971 A1 | * | 3/2018 | Lin | H01L 24/83 |
| 2018/0090866 A1 | * | 3/2018 | Kakiuchi | H01L 41/0477 |
| 2018/0143499 A1 | * | 5/2018 | Lim | G02F 1/136209 |

FOREIGN PATENT DOCUMENTS

| | | |
|---|---|---|
| CN | 107565056 | 1/2018 |
| CN | 107613675 | 1/2018 |
| GB | 2412790 | 10/2005 |
| JP | 2003-295216 | 10/2003 |
| JP | 2006-210610 | 8/2006 |

* cited by examiner

FLEXIBLE CIRCUIT BOARD, DISPLAY PANEL, AND DISPLAY MODULE

RELATED APPLICATIONS

This application is a National Phase of PCT Patent Application No. PCT/CN2018/113946 having International filing date of Nov. 5, 2018, which claims the benefit of priority of Chinese Patent Application No. 201810622686.6 filed on Jun. 15, 2018. The contents of the above applications are all incorporated by reference as if fully set forth herein in their entirety.

FIELD AND BACKGROUND OF THE INVENTION

The present disclosure is related to the field of display technology, and in particular to a flexible circuit board, a display panel, and a display module.

Maturity of liquid crystal display (LCD) technology has promoted rapid development of electronic devices, such as smart phones and tablet computers.

Among them, a liquid crystal display panel needs to be under control of an external integrated circuit (IC), so that a picture can be presented quickly and accurately. It can use a chip on film (COF) packaging technology to fulfill interconnection of the liquid crystal display panel and the integrated circuit. Specifically, the integrated circuit is laminated onto the liquid crystal display by an anisotropic conductive film.

Because a distance between the display panel and the edge of the panel is less and less in a narrow bezel display, as shown in FIG. 1, and a flexible circuit board 1000 is used to carry an integrated circuit 2000, in the process of laminating the flexible circuit board 1000 and a display panel 3000 and after an anisotropic conductive film colloid 4000 is melted by heat, it flows to the edge area of the display panel 3000, and the display panel 3000 and a glass substrate 5000 are connected together. It causes the display panel 3000 to be difficult to peel off from the glass substrate 5000, resulting a decreased yield rate of the display panel 3000.

SUMMARY OF THE INVENTION

A goal of the disclosure is to provide a flexible circuit board, display panel and display module and increase a yield rate of the display module.

A flexible circuit board is provided in the embodiments of the disclosure and the flexible circuit board is connect to a display panel, including a substrate layer and a colloid layer.

The substrate layer has a lamination area and a non-lamination area, and the lamination area is configured to laminate and connect the flexible circuit board with the display panel together, wherein the lamination area includes a guiding structure;

the colloid layer is disposed on a side surface of the substrate layer having the guiding structure, and the guiding structure is configured to guide a flow direction of a colloid in the colloid layer when the colloid layer is melted by heat.

In some embodiments, the colloid layer includes a plurality of charged particles, the lamination area further includes a plurality of terminals, the guiding structure includes a plurality of recesses which are alternately arranged with and spaced apart from the terminals, a width of each of the recesses is greater than a diameter of each of the charged particles, a depth of each of the recesses is 0-200 μm, and a length of each of the recesses is 0-1000 μm.

In some embodiments, the guiding structure further includes a plurality of through holes, the through holes are alternately arranged with and spaced apart from the terminals, a diameter of each of the through holes is greater than the diameter of each of the charged particles, and a spacing between two of the through holes adjacent to each other is 5-15 μm.

In some embodiments, the diameter of each of the through holes is 3-10 μm.

A display panel is provided in the embodiments of the disclosure, and the display panel is configured to connect with a flexible circuit board, includes: a substrate having a laminated area and a non-laminated area, wherein the laminated area is configured to laminate and connect the display panel with the flexible circuit board, and the laminated area includes a guiding structure;

a colloid layer disposed on a side surface of the substrate layer having the guiding structure, wherein the guiding structure is configured to guide a flow direction of a colloid in the colloid layer when the colloid layer is melted by heat.

In some embodiments, the laminated area further includes a plurality of conductive pads, the guiding structure further includes a U-shaped recess, the U-shaped recess incompletely surrounds the conductive pads, and an opening of the U-shaped recess faces toward a display area of the display panel.

In some embodiments, a depth of the U-shaped recess is 0-20 μm, and a width of the U-shaped recess is 0-20 μm.

A display module is provided in the embodiments of the disclosure, the display module includes a flexible circuit board, a display panel and a colloid layer;

the flexible circuit board includes a substrate layer, and the substrate layer having a lamination area and a non-lamination area:

the display panel includes a substrate having a laminated area and a non-laminated area, wherein the laminated area is disposed opposite to the lamination area, and the laminated area and the lamination area are configured to laminate and connect the display panel and the flexible circuit board together;

the colloid layer is disposed between the lamination area of the flexible circuit board and the laminated area of the display panel;

the laminated area and/or the lamination area includes a guiding structure, and the guiding structure is configured to guide a flow direction of a liquid colloid in the colloid layer when the colloid layer is melted by heat.

In some embodiments, the colloid layer includes a plurality of charged particles, and the lamination area further includes a plurality of terminals, the laminated area further includes a plurality of conductive pads, and the charged particles are configured to electrically connect the terminals with the conductive pads.

In some embodiments, the guiding structure includes a plurality of recesses, the recesses are disposed in the lamination area, the recesses are alternately arranged with and spaced apart from the terminals, a width of each of the recesses is greater than a diameter of each of the charged particles, a depth of each of the recesses is 0-200 μm, and a length of each of the recesses is 0-1000 μm.

In some embodiments, a width of each of the recesses is 3-10 μm.

In some embodiments, the guiding structure further includes a plurality of through holes, the through holes are disposed in the lamination area, the through holes are alternately arranged with and spaced apart from the terminals, a diameter of each of the through holes is greater than a diameter of each of the charged particles, and a spacing between two of the through holes adjacent to each other is 5-15 μm.

In some embodiments, a diameter of each of the through holes is 3-10 μm.

In some embodiments, the guiding structure further includes a U-shaped recess, the U-shaped recess incompletely surrounds the conductive pads, and an opening of the U-shaped recess faces toward a display area of the display panel.

In some embodiments, a depth of the U-shaped recess is 0-20 μm, and a width of the U-shaped recess is 0-20 μm The flexible circuit board, display panel and display module of the embodiments of the disclosure provide a flow guiding structure and guide the flow direction of the excess liquid colloid by using the flow guiding structure during the process of laminating the flexible circuit board and the display panel, thereby increasing the yield rate of the display panel.

BRIEF DESCRIPTION OF THE SEVERAL VIEWS OF THE DRAWINGS

In order to make the above-mentioned contents of the present disclosure more comprehensible, the preferred embodiments are described below, and in conjunction with the drawings, the detailed description is as follows.

DESCRIPTION OF SPECIFIC EMBODIMENTS OF THE INVENTION

Figure 1:
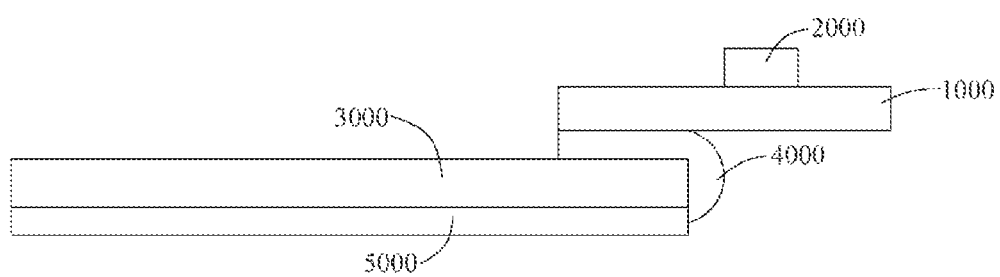
FIG. 1 is a scene schematic view of a lamination of a current flexible circuit board and a display panel.

The following description of each embodiment refers to the additional drawings, in order to illustrate the specific embodiments that may be implemented by the present disclosure. The directional terms mentioned in this invention, such as [upper], [lower], [front], [post], [left], [right], [inside], [outside], [side], etc., are only refers to the direction of the additional drawings. Therefore, the terms are used to illustrate and understand the present invention, not to limit the present invention.

In the drawings, structurally similar elements are denoted by the same reference numerals.

The "embodiments" are referred in the context which means that the specific features, structures, or characteristics described in connection with the embodiments can be included in at least one embodiment of the invention. The appearances of the phrases in various places in the specification are not necessarily referring to the same embodiments, and are not exclusive or alternative embodiments that are mutually exclusive. Those skilled in the art will understand and implicitly understand that the embodiments described herein can be combined with other embodiments.

Figure 2:
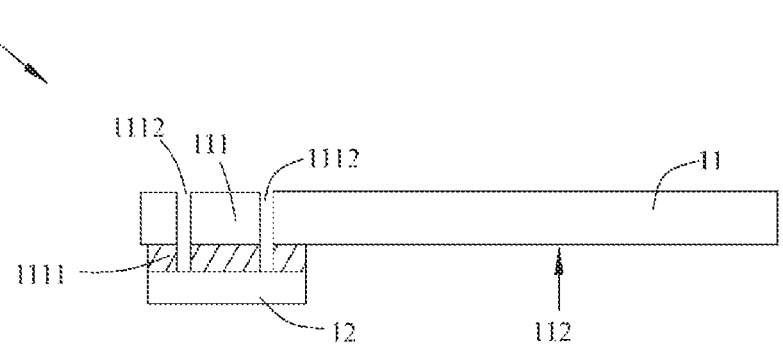
FIG. 2 is a schematic view of a first structure of a flexible circuit board according to embodiments of the disclosure.

A flexible circuit board, a display panel and a display module are provided in the disclosure. The flexible circuit board is configured to connect with the display panel. With reference to FIG. 2, and FIG. 2 is a schematic view of the structure of the flexible circuit board according to the embodiments of the disclosure. The flexible circuit board 1 further includes a substrate layer 11 and a colloid layer 12, wherein the substrate layer 11 further has a lamination area 111 and a non-lamination area 112.

Wherein the substrate layer 11 has the lamination area 111 and the non-lamination area 112, and the lamination area 111 is configured to laminate and connect the flexible circuit board 1 with the display panel together. The lamination area 111 further includes a plurality of terminals 1111, and the terminals 1111 have conductive properties. The colloid layer 12 includes a substrate and charged particles, wherein the substrate may be a thermosetting resin and the charged particles are encapsulated in the substrate. After the colloid layer 12 is hot pressed, the charged particles are released, and the flexible circuit board 1 is electrically connect with the display panel by the electrical connection between the charged particles and the terminals 1111. Specifically, the constituent material of the colloid layer 12 may be an anisotropic conductive film, and the anisotropic conductive film may be formed by a screen printing method, a slot-die coating method, and an electrostatic spray method.

In order to avoid the diffusion of a colloid in the colloid layer 12 to the edge region of the display panel, resulting the display panel and the glass substrate being connected together, and the display panel is peeled off during the process of laminating the flexible circuit board and the display panel as shown in FIG. 1. As shown in FIG. 2, a guiding structure 1112 may be disposed in the lamination area 111, and the colloid layer 12 may be disposed on a side surface of the substrate layer 11 having the guiding structure 1112. Thereby, the flow direction of the liquid colloid in the colloid layer 12 is guided by the guiding structure 1112 when the colloid layer 12 is melted by heat.

Figure 3:
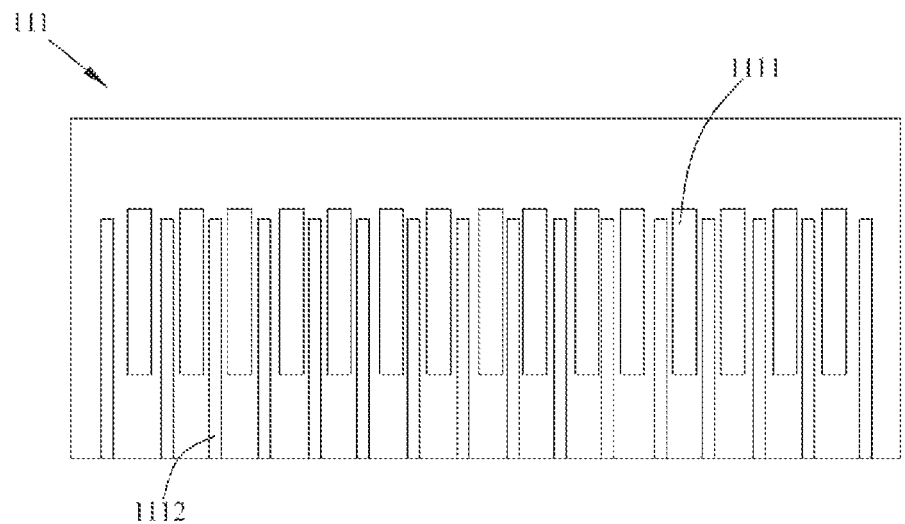
FIG. 3 is a schematic view of a second structure of the flexible circuit board according to embodiments of the disclosure.

As shown in FIG. 3, the guiding structure 1112 includes a plurality of recesses, and the recesses are alternately arranged with and spaced apart from the terminals. Wherein, a depth of each of the recesses is 0-200 μm, a length of each of the recesses is 0-1000 μm, and preferably a length of each of the recesses is 600-800 μm. A width of each of the recesses is smaller than a spacing between the adjacent terminals 1111 and the width of each of the recesses preferably is 3-10 μm. In order to prevent the charged particles in the recesses from being connected in series, the width of each of the recesses may be larger than the diameter of each of the charged particles. Specifically, laser cutting can be performed on the lamination area 111, and carbonization residues are removed to form the recesses.

Figure 4:
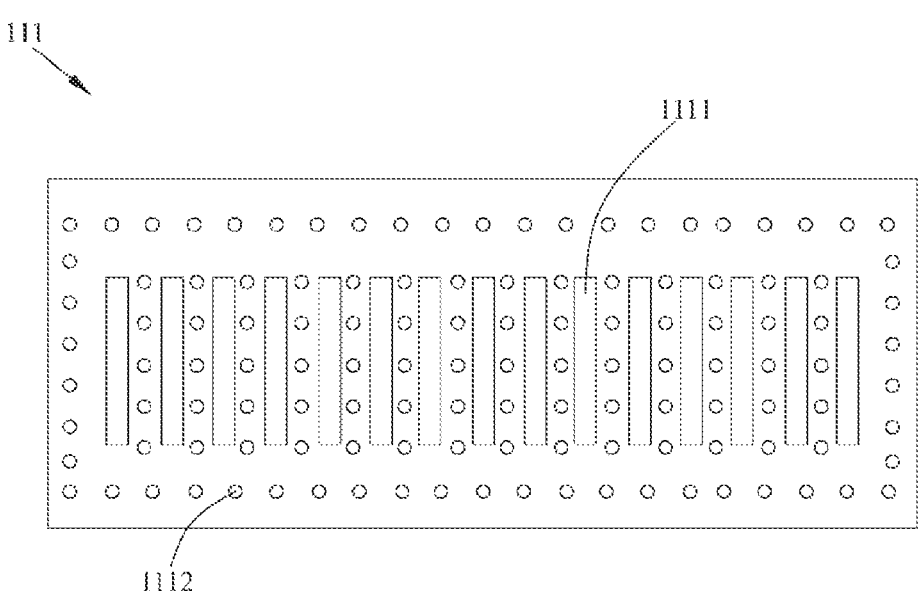
FIG. 4 is a schematic view of a third structure of the flexible circuit board according to embodiments of the disclosure.

In some embodiments, as shown in FIG. 2 and FIG. 4, the guiding structure 1112 further includes a plurality of through holes, and the through holes are alternately arranged with and spaced apart from the terminals 1111. A diameter of each of the through holes is 3-10 μm, preferably, a diameter of each of the through holes is greater than the diameter of each of the charged particles and smaller than the spacing between the terminals 1111 adjacent to each other. A spacing between the through holes adjacent to each other is 5-15 μm.

According to the embodiments of the disclosure, the flexible circuit board increases a yield rate of the display panel through disposing the guiding structure and guides the flow direction of the excess liquid colloid by the guiding structure during the lamination of the display panel.

Figure 5:
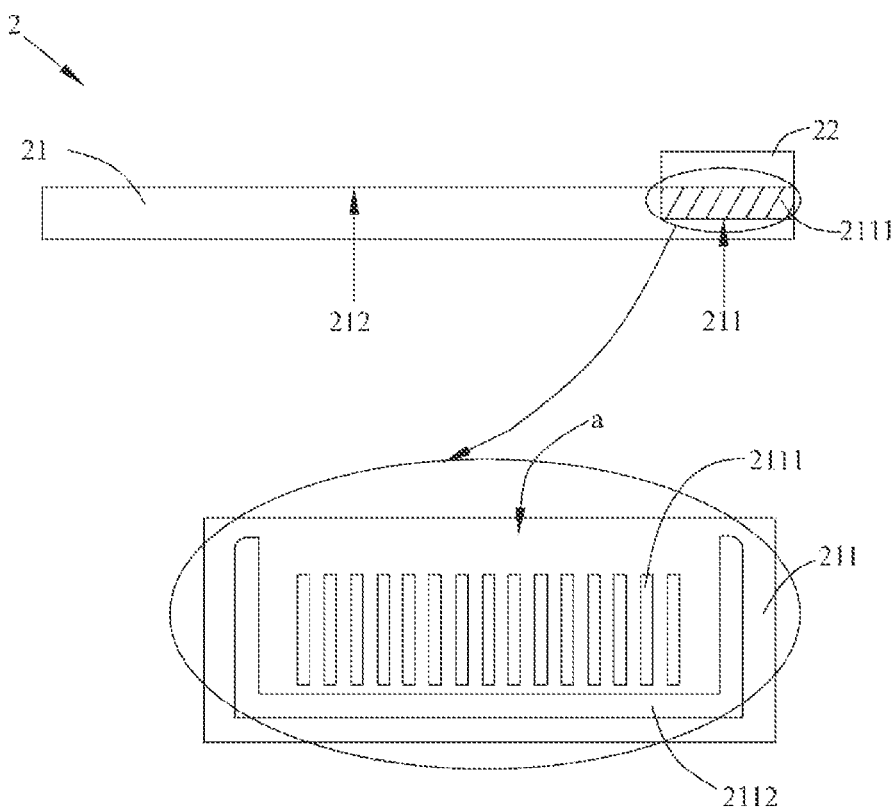
FIG. 5 is a schematic view of a structure of the display panel according to embodiments of the disclosure.

A display panel according to the embodiments of the disclosure is further provided, and the display panel is configured to connect with the flexible circuit board. With reference to FIG. 5, and FIG. 5 is a schematic view of the structure of the display panel according to the embodiments of the disclosure. The display panel 2 further includes a substrate 21 and a colloid layer 22. Wherein, the substrate 21 is a flexible substrate, the substrate 21 has a laminated area 211 and a non-laminated area 212, the laminated area 211 is configured to laminate and connect the display panel 2 and the flexible circuit board together, the laminated area 211 includes a plurality of the conductive pads 2111 and the conductive pads 2111 has conductive properties. The colloid layer 22 includes a substrate material and charged particles, wherein the substrate material may be a thermosetting resin and the charged particles are encapsulated in the substrate. After the colloid layer 22 is hot pressed, the charged particles are released, and the display panel 2 is electrically connect with the flexible circuit board by the electrical connection between the charged particles and the conductive pads 2111. Specifically, the constituent material of the colloid layer 22 may be an anisotropic conductive film, and the anisotropic conductive film may be formed by a screen printing method, a slot-die coating method, and an electrostatic spray method.

In order to avoid the diffusion of a colloid in the colloid layer 22 to the edge region of the display panel, and resulting the display panel and the glass substrate being connected together, and the display panel is peeled off during the process of laminating the flexible circuit board and the display panel as shown in FIG. 1. A guiding structure 2112 may be disposed in the laminated area 211, and the colloid layer 22 may be disposed on a side surface of the substrate layer 21 having the guiding structure 2112, and the guiding structure 2112 is configured to guide a flow direction of a colloid in the colloid layer 21 during the colloid layer 21 is melted by heat.

As shown in FIG. 5, the guiding structure 2112 further includes a U-shaped recess, the U-shaped recess incompletely surrounds the conductive pads 2111, and an opening of the U-shaped recess faces toward a display area (a) of the display panel 2, wherein the display area (a) is configured to screen display. Wherein a depth of the U-shaped recess is 0-20 μm, and a width of the U-shaped recess is 0-20 μm, it should be noted that the width may be determined according to the width of the wireless path region around the conductive pad 2111, and it is not specifically limited herein. Further, the U-shaped recesses are not in contact with a short side of the conductive pad 2111 in order to prevent the conductive pad 2111 from being short-circuited. Specifically, laser cutting can be performed on the recesses 211, and carbonization residues are removed to form the U-shaped recesses.

The display panel provided by the embodiments of the disclosure, and the flexible circuit board increases a yield rate of the display panel through disposing the guiding structure and guides the flow direction of the excess liquid colloid by the guiding structure during the lamination of the display panel.

Figure 6:
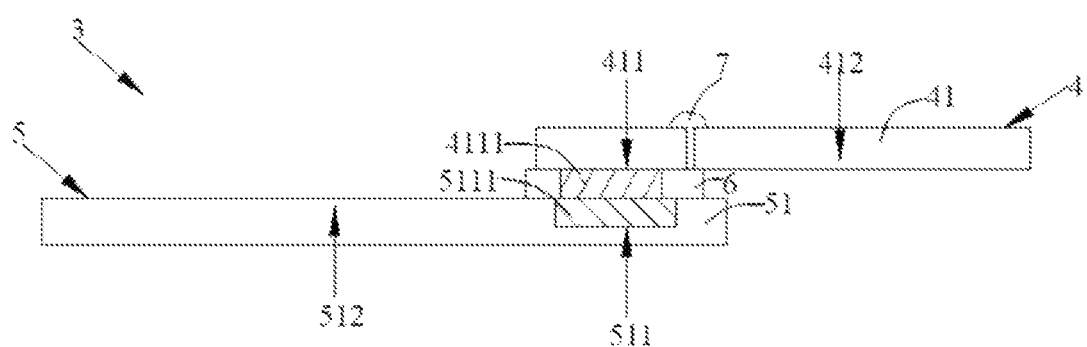
FIG. 6 is a schematic view of a first structure of a display module according to embodiments of the disclosure.

The display module is further provided by the embodiments of the disclosure. With reference to FIG. 6, and FIG. 6 is a schematic view of the structure of the display module according to the embodiments of the disclosure. The display module 3 includes a flexible circuit board 4, a display panel 5 and a colloid layer 6.

The flexible circuit board 4 includes a substrate layer 41, and the substrate layer 41 has a lamination area 411 and a non-lamination area 412. The lamination area 411 includes a plurality of terminals 4111 and each of the terminals 4111 has conductive properties.

The display panel 5 includes a substrate 51, and the substrate 51 has a laminated area 511 and a non-laminated area 512. The laminated area 511 includes a plurality of conductive pads 5111 and each of the conductive pads 5111 has conductive properties. The laminated area 511 is disposed opposite to the lamination area 411, and the laminated area 511 and the lamination area 411 are configured to laminate and connect the display panel 5 and the flexible circuit board 4 together.

The colloid layer 6 includes a substrate material and charged particles, wherein the substrate material may be a thermosetting resin and the charged particles are encapsulated in the substrate. After the colloid layer 6 is hot pressed, the charged particles are released and the display panel 5 is configured to electrically connect with the flexible circuit board 4 by the charged particles are electrically connected to the terminals 411 and the conductive pads 5111, respectively. Specifically, the constituent material of the colloid layer 6 may be an anisotropic conductive film, and the anisotropic conductive film may be formed by a screen printing method, a slot-die coating method, and an electrostatic spray method.

In order to avoid the diffusion of a colloid in the colloid layer 6 to the edge region of the display panel, resulting the display panel and the glass substrate being connected together, and the display panel is peeled off during the process of laminating the flexible circuit board and the display panel as shown in FIG. 1. A guiding structure 7 is disposed in the laminated area 511 and/or the lamination area 411, and the guiding structure 7 is configured to guide a flow direction of a colloid in the colloid layer when the colloid layer is melted by heat.

Figure 7:
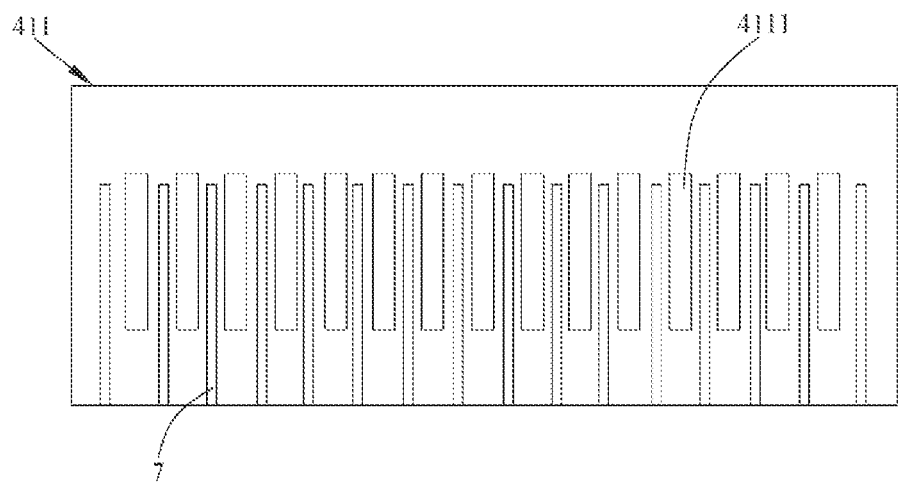
FIG. 7 is a schematic view of a second structure of the display module according to embodiments of the disclosure.

As shown in FIG. 7, the guiding structure includes a plurality of recesses which are arranged in the lamination area 411. The recesses are alternately arranged with and spaced apart from the terminals 4111. Wherein a depth of each of the recesses is 0-200 μm, and a length of each of the recesses is 0-1000 μm, preferably the length of each of the recesses is 600-800 μm. The width of each of the recesses is smaller than the spacing between adjacent pin terminals 4111, and the preferred width is 3-10 μm. In order to prevent the charged particles in the recesses from being connected in series, the width of each of the recesses may be larger than the diameter of the charged particles. Specifically, laser cutting can be performed on the recesses 411, and carbonization residues are removed to form the recesses.

Figure 8:
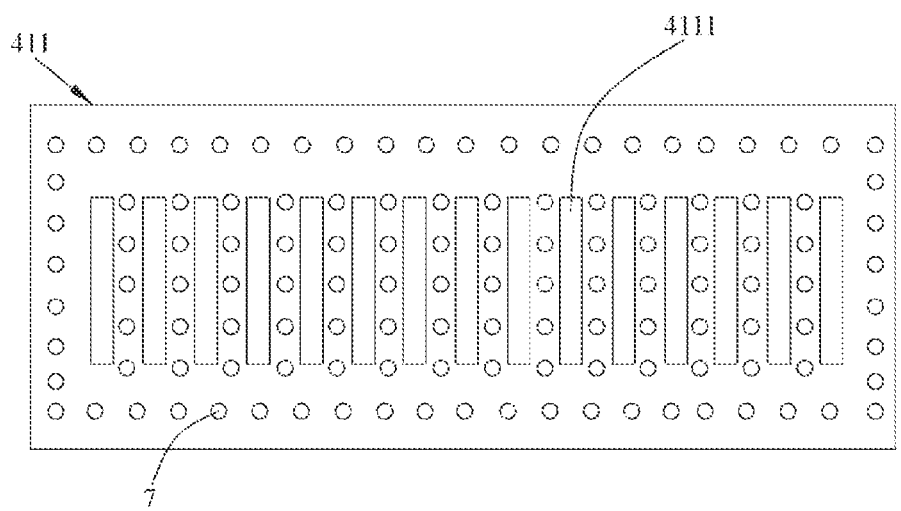
FIG. 8 is a schematic view of a third structure of the display module according to embodiments of the disclosure.

In some embodiments, as shown in FIG. 8, the guiding structure 7 further includes a plurality of through holes, the through holes are arranged in the lamination area 411. The through holes are alternately arranged with and spaced apart from the terminals 4111, and a diameter of each of the through holes is 3-10 μm. Preferably, a diameter of each of the through holes is greater than the diameter of each of the charged particles, and smaller than a spacing between two of the through holes adjacent to each other is 5-15 μm.

Figure 9:
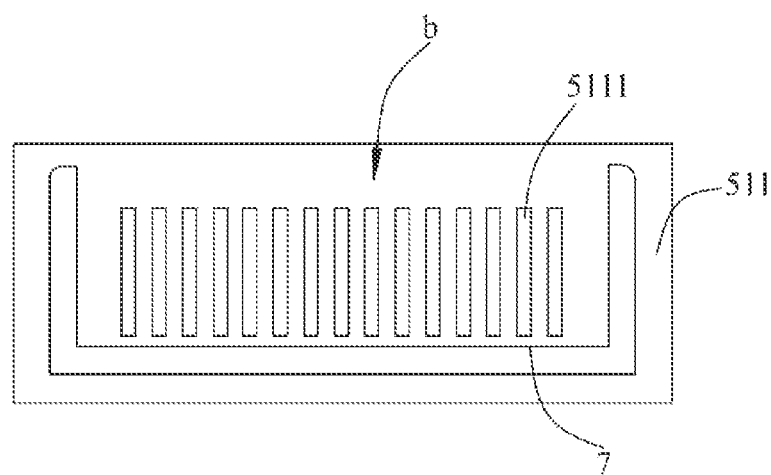
FIG. 9 is a schematic view of a fourth structure of the display module according to embodiments of the disclosure.

As shown in FIG. 9, the guiding structure 7 further includes a U-shaped recess, and the U-shaped recess is arranged in the laminated area 511. The U-shaped recess incompletely surrounds the conductive pads 5111, and an opening of the U-shaped recess faces toward a display area (b) of the display panel 5, wherein the display area (b) is configured to screen display. Wherein a depth of the U-shaped recess is 0-20 μm, a width of the U-shaped recess is 0-20 μm, and it should be noted that the width may be determined according to the width of the wireless path region around the conductive pad 5111, and it is not specifically limited herein. Further, the U-shaped recess is not in contact with a short side of the conductive pad 5111 to prevent the conductive pad 5111 from being short-circuited. Specifically, laser cutting can be performed on the laminated area 511, and carbonization residues are removed to form the U-shaped recess.

The display module of the embodiments of the disclosure increases a yield rate of the display panel by arranging the guiding structure on the flexible circuit board and/or the display panel, and guide the flow direction of the excess liquid colloid by using the guiding structure during the process of laminating the flexible circuit board and the display panel In the above, the present disclosure has been disclosed in the above preferred embodiments, but the preferred embodiments are not intended to limit the present invention, and those skilled in the art can make various modifications without departing from the spirit and scope of the disclosure, and the scope of the disclosure is defined by the claims.

What is claimed is:

1. A display module, comprising a flexible circuit board, a display panel and a colloid layer;
    the flexible circuit board comprising a substrate layer, and the substrate layer having a lamination area and a non-lamination area;
    the display panel comprising a substrate having a laminated area and a non-laminated area, wherein the laminated area of the display panel is disposed opposite to the lamination area, of the flexible circuit board, and the laminated area of the display panel and the lamination area of the flexible circuit board are configured to laminate and connect the display panel and the flexible circuit board together;
    the colloid layer is disposed between the lamination area of the flexible circuit board and the laminated area of the display panel, wherein the colloid layer comprises a plurality of charged particles, and the lamination area of the flexible circuit board further comprises a plurality of terminals, the laminated area of the display panel further comprises a plurality of conductive pads, and the charged particles are configured to electrically connect the terminals with the conductive pads;
    the laminated area of the display panel and/or the lamination area of the flexible circuit board comprises a guiding structure, and the guiding structure is configured to guide a flow direction of a liquid colloid in the colloid layer when the colloid layer is melted by heat, wherein the guiding structure further comprises a U-shaped recess, the U-shaped recess incompletely surrounds the conductive pads and an opening of the U-shaped recess faces toward a display area of the display panel.

2. The display module as claimed in claim 1, wherein the guiding structure comprises a plurality of recesses, the recesses are disposed in the lamination area, the recesses are alternately arranged with and spaced apart from the terminals, a width of each of the recesses is greater than a diameter of each of the charged particles, a depth of each of the recesses is 0-200 μm, and a length of each of the recesses is 0-1000 μm.

3. The display module as claimed in claim 2, wherein a width of each of the recesses is 3-10 μm.

4. The display module as claimed in claim 1, wherein the guiding structure further comprises a plurality of through holes, the through holes are disposed in the lamination area, the through holes are alternately arranged with and spaced apart from the terminals, a diameter of each of the through holes is greater than a diameter of each of the charged particles, and a spacing between two of the through holes adjacent to each other is 5-15 μm.

5. The display module as claimed in claim 4, wherein a diameter of each of the through holes is 3-10 μm.

6. The display module as claimed in claim 1, wherein a depth of the U-shaped recess is 0-20 μm, and a width of the U-shaped recess is 0-20 μm.

* * * * *